Dec. 15, 1970 P. BASSE ET AL 3,548,203

HIGH FREQUENCY RECIPROCAL COUNTING CIRCUITS EMPLOYING A PLURALITY OF BISTABLE CIRCUITS SEQUENTIALLY COUPLED TO A SUCCEEDING CIRCUIT BY MEANS OF COINCIDENCE GATES AND SWITCHES

Filed Oct. 9, 1967 3 Sheets-Sheet 1

INVENTORS
Philip Basse &
Patrick J. Murphy

Dec. 15, 1970 P. BASSE ET AL 3,548,203

HIGH FREQUENCY RECIPROCAL COUNTING CIRCUITS EMPLOYING A PLURALITY OF BISTABLE CIRCUITS SEQUENTIALLY COUPLED TO A SUCCEEDING CIRCUIT BY MEANS OF COINCIDENCE GATES AND SWITCHES

Filed Oct. 9, 1967 3 Sheets-Sheet 2

INVENTORS
Philip Basse &
Patrick J. Murphy

Dec. 15, 1970 P. BASSE ET AL 3,548,203

HIGH FREQUENCY RECIPROCAL COUNTING CIRCUITS EMPLOYING A PLURALITY OF BISTABLE CIRCUITS SEQUENTIALLY COUPLED TO A SUCCEEDING CIRCUIT BY MEANS OF COINCIDENCE GATES AND SWITCHES

Filed Oct. 9, 1967 3 Sheets-Sheet 3

INVENTORS
Philip Basse &
Patrick J. Murphy

United States Patent Office 3,548,203

Patented Dec. 15, 1970

3,548,203

HIGH FREQUENCY RECIPROCAL COUNTING CIRCUITS EMPLOYING A PLURALITY OF BISTABLE CIRCUITS SEQUENTIALLY COUPLED TO A SUCCEEDING CIRCUIT BY MEANS OF COINCIDENCE GATES AND SWITCHES

Philip Basse, New York, N.Y., and Patrick J. Murphy, Jersey City, N.J., assignor to Sapien Electronics Corporation, a corporation of New York

Filed Oct. 9, 1967, Ser. No. 673,634

Int. Cl. H03k *23/02, 23/22*

U.S. Cl. 307—225 8 Claims

ABSTRACT OF THE DISCLOSURE

There is disclosed a scaling circuit in which a plurality of bistable devices are arranged in conjunction with a series of gates to provide a high speed scaling or dividing operation of a clock source input frequency. Each bistable circuit is triggered in a sequence determined by the state of the preceding stage. When this occurs the last stage activates another gate which controls further gates assuring that each bistable device is turned off in sequence. The further gates are controlled, as well, by the status of the preceding stage. The scaler lends itself to programming or control of its scaling factor by a suitable switching arrangement in a manner to obtain odd or even scaling factors which in turn can be changed by a single integer.

BACKGROUND OF INVENTION

In counting devices used for frequency or speed measurements, interval timing and direct counting, in general, the art has been concerned with high speed operation together with suitable circuits capable of easy fabrication while maintaining reasonable cost.

Hence the prior art shows such devices, commonly referred to as scalers or frequency dividers, as a series of bistable transistor circuits or flip-flops arranged in a conventional binary counting circuit format. For circuits employed in such prior art devices see for example "Pulse and Digital Circuits" by Millman and Taub, McGraw-Hill, 1956, chapter 11 entitled "Counting," pp. 323–353. Many of these conventional counters suffer in their speed of operation in that the total resolution of the counter is dependent upon the response of the first stage which always operates at a frequency equal to one-half the input clock frequency. Moreover, when it is desired to count to a scale other than a binary number as three, five, seven and so on, feedback circuitry is employed (see above reference pp. 328–330). These feedback gates and circuits offer greater time delay and hence serve to further decrease the resolution of the counter. Therefore in order to avoid this problem other configurations have been used, such as the ring counter (see above reference p. 343) to count to scales of $n$ not necessarily binary. In such a circuit two active devices are used to count or scale by the factor $n$. Hence to scale by 7 one needs 14 transistors or tubes. Furthermore, the problem of higher speed operation, for instance in excess of 100 mHz., results in more sophisticated flip-flop design as such high speed counters present in the art, use non-saturated flip-flops and other techniques so as to minimize the effects of stored base charge; and in combination with this design utilize high speed transistors, which are costly and difficult to obtain. In any case there is a need for a scaling circuit which can scale by any integer at high speed and further have the capability of changing its scaling factor easily while maintaining high speed operation.

To accomplish this in prior art devices requires changing gating inputs by rewiring or reconnecting to ot her stages or by different feedback arangements and so on. These solutions affect the response and in general slow up the circuit operation.

It is therefore an object of the present invention to provide a scaler with an increased speed of operation.

It is a further object to provide an improved programmable scaler capable of having its scaling factor changed by single digit integers.

A further object is to provide an improved circuit particularly useful for time, frequency and speed measurements.

A further object is to provide a scaler capable of operating at any integer scaling factor below a maximum determined by the number of stages.

Still a further object is to provide an improved high speed scaler which is easy to fabricate and inexpensive in cost.

SUMMARY OF THE INVENTION

The above and further objects of the present invention are accomplished in one embodiment by employing a series of binary devices, such as transistor flip-flops. The flip-flops are coupled to each other and to a clock circuit through a series of gates. Each flip-flop has two separate input gates, one of which is associated with its reset input and another gate associated with the flip-flop's set input. One input to the gate is controlled by the status of the preceding stage, while the other input is coupled to either the output of a master set or a master reset gate, depending on which input of the flip-flop the gate is controlling. The master set and reset gates are further controlled by alternate sides of the last flip-flop in the chain. In this manner the chain will scale or count at high frequency clock rates and by coupling the preceding flip-flop's status, through a control switch or suitable circuit, to the succeeding stage the scaling factor, or countdown capability, can be changed by a single integer at a time.

DETAILED DESCRIPTION OF FIGURES

Figure 1:
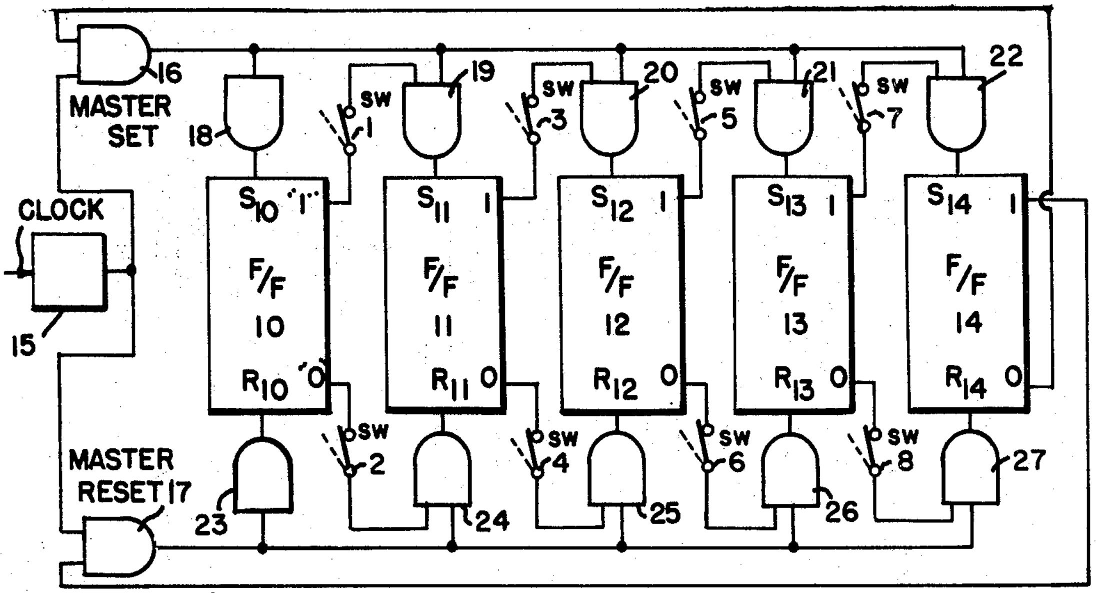
FIG. 1 is a block diagram of a scaler according to this invention.

If reference is made to FIG. 1 there is shown five flip-flops respectively designated as F/F 10 to F/F 14. Each of the devices is capable of exhibiting and maintaining any one of two stable states. Circuits for implementing such devices are known in the art and reference is made to "G.E. Transistor Manual," 5th ed., 1960, chapter 11, "Computer Circuits," pp. 106–122. If reference is made to F/F 10 it is seen that the following terminals are specified, namely, S, R, "1" and "0." The S terminal functions in the following manner. If a logical one or "1" is impressed on the S or set input of F/F 10 the "1" side of the flip-flop assumes the logical one condition and will stay in this state until a logical one is impressed on the "R" terminal or reset input of the F/F 10. In this case the "1" side reverts to a logical zero and the "0" side assumes a logical one. The set input of F/F 10, $S_{10}$ and the reset input, $R_{10}$ are sometimes referred to as the D.C. set and reset inputs as opposed to an alternating trigger input. Such inputs are afforded in conventional circuitry by diode coupling of the base circuits of the transistors comprising the flip-flop. Each flip-flop, as F/F 10 to F/F 14, has the four described terminals associated with it and the operation of each is as described above.

Numeral 15 references a clock source, which may be a tunnel diode, high speed transistor or transistor-diode shaping circuit. The function of the circuit 15 is to shape the input clock, which may be at a high repetition rate, so that it possesses a rise time capable of supplying an efficient trigger at its output. Circuits to shape by limiting and differentiating or by producing fast rise time pulses from a clock source are known in the art and not considered part of this invention. The output of the clock shaper circuit 15 is coupled to one input of two gates 16 and 17 which are labelled as the master set and master reset gates respectively. The gates 16 and 17 are "and" gates and perform the following logical functions according to the table shown.

| Logical condition of input No. 1 | Logical condition of Input No. 2 | Logical condition of output of and gate |
|---|---|---|
| 0 | 0 | 0 |
| 0 | 1 | 0 |
| 1 | 0 | 0 |
| 1 | 1 | 1 |

Further descriptions of the "and" function can be found in any conventional text on Logic for example, see the above reference, pp. 125–137, for various examples of circuits which are capable of performing the "and" or coincidence function. Such "and" gates as 16 and 17 can perform according to the table shown by many different circuits configurations, irrespective of the polarity of the voltage value assigned to the logical conditions defining the "0" or "1" state. The other input of the master set gate 16 is coupled to the "0" side of F/F 14; while the other input of the master reset gate 17 is coupled to the "1" side of F/F 14. In this manner the outputs of the gates 16 and 17 are a function of both the clock shaping circuit 15's output and the state of F/F 14. The output of the master set gate 16 is coupled to an input of gates 18, 19, 20, 21 and 22 whose outputs are respectively associated with the set leads $S_{10}$ to $S_{14}$ of F/F's 10 to 14. Gate 18 is shown as a single input gate, whose output is coupled to the $S_{10}$ terminal of F/F 10. The "1" terminal of F/F 10 is coupled through a single pole double throw switch $SW_1$ to another input of gate 19. Gate 19 also performs an "and" function. The output of gate 19 is coupled to the set input $S_{11}$ of F/F 11. The "1" side of F/F 11 is coupled through another single pole double throw switch $SW_3$ to the other input of "and" gate 20, whose output is coupled to $S_{12}$, the set side of F/F 12. The "1" side of F/F 12 is coupled through $SW_5$ to an input of "and" gate 21 whose output is coupled to the set side $S_{13}$ of F/F13. Flip-flop 13's "1" side is coupled through $SW_7$ to an input of "and" gate 22 whose output is coupled to the set side 14 of F/F 14. The "1" side of F/F 14, as previously indicated, is coupled to an input of the master reset gate 17.

In a similar manner the master reset gate 17's output is coupled to a separate input of gates 23 to 27. Hence the output of gate 17 is coupled to the input of gate 23 whose output is coupled to the reset input, $R_{10}$, of F/F 10. The zero or "0" side of F/F 10 is coupled through $SW_2$ to the other input of gate 24. The output of gate 24 is coupled to the reset side, $R_{11}$, of F/F 11. The "0" side of F/F 11 is coupled through $SW_4$ to an input of "and" gate 25, whose output is coupled to $R_{12}$ of F/F 12. The "0" side of F/F 12 is coupled through $SW_6$ to "and" gate 26 whose output is coupled to the reset input of F/F 13. The "0" side of F/F 13 is coupled through $SW_8$ to an input of "and" gate 27, whose output is coupled to the reset input $R_{14}$ of F/F 14. The "0" side of F/F 14, as described, is coupled to the other input of the master set gate 16. It is noted that the switches $SW_1$ to $SW_8$ are shown schematically as each having an open and closed position. The closed position, shown in FIG. 1 by the solid line, couples the respective output side of the flip-flops F/F 10 to F/F 14 to the input of the associated "and" gate. When a switch, as $SW_1$, is in the dotted or dashed position, the "1" side of the associated flip-flop, as F/F 10, is no longer coupled and hence would not control gate 19. In this case gate 19 then becomes a single input gate for operational purposes. The remaining switches $SW_2$ to $SW_8$ perform in the same manner when in their dashed or solid positions. The switches $SW_1$ to $SW_8$ may be any switching device capable of presenting a low impedance in one state and a high impedance in the other. Hence in lieu of relays or mechanical switches, one may use diodes, transistors and so on. There are many devices which will perform the function described for $SW_1$ to $SW_8$; and any such device can be utilized.

Figure 2:
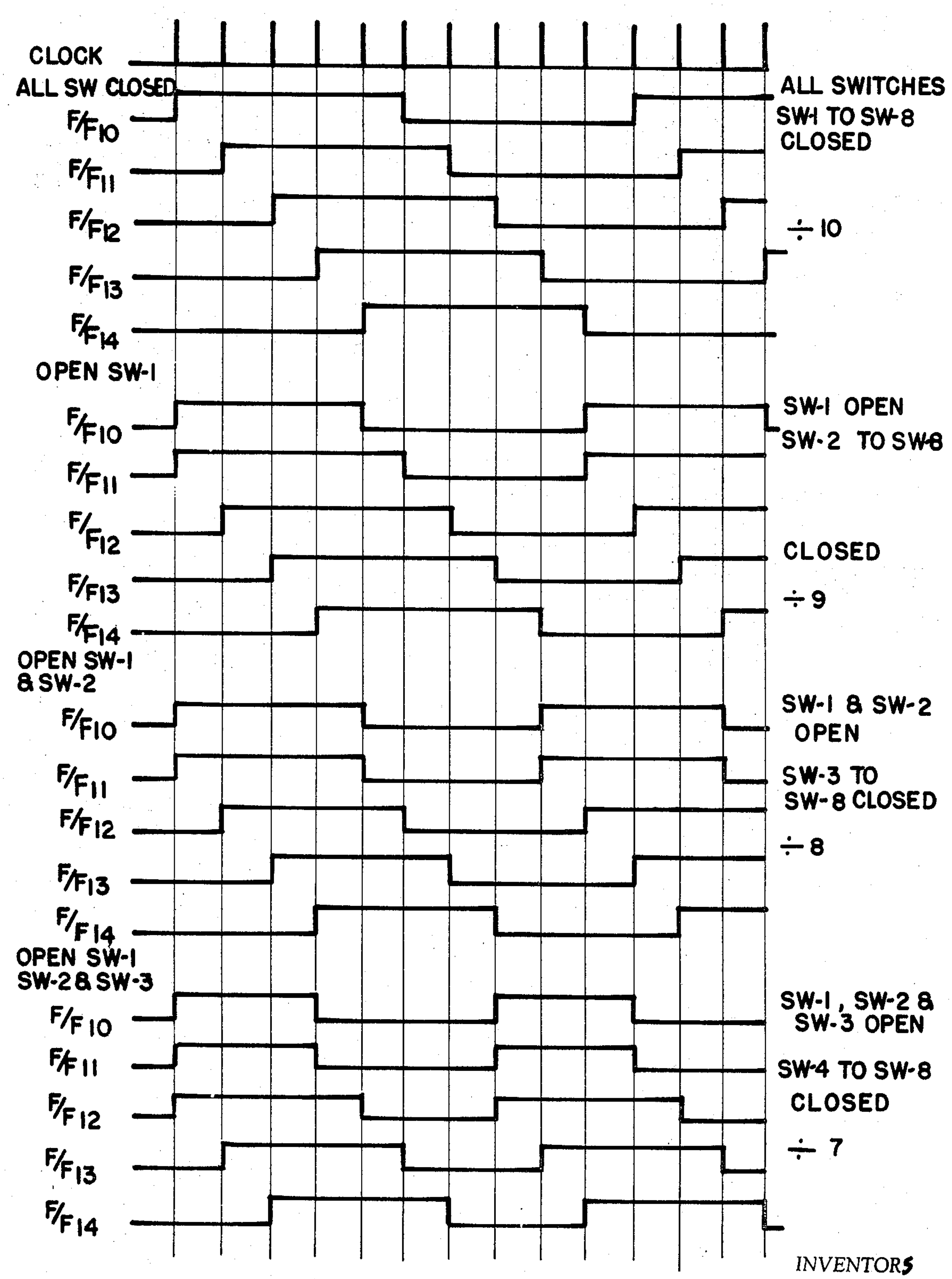
FIG. 2 is a series of timing diagrams used in explaining the operation of FIG. 1.

If reference is made to FIG. 2 the operation of the circuit of FIG. 1 will be described. FIG. 2 shows the clock waveshape present at the output of the clock shaper circuit 15 of FIG. 1. It is assumed that all of the F/F's 10 to 14 of FIG. 1 are in the reset condition and hence their "0" sides are at logical one. The "0" side of F/F 14 being at logic "1" will enable the master set gate 16 during the presence of a clock pulse. It is also noted that the operation to be described first, is implemented with switches $SW_1$ to $SW_8$ operating in the closed or solid line position of FIG. 1. The first clock pulse passes through the master set gate 16 and through gate 18 as a logical one where the output of gate 18 sets F/F 10 at the $S_{10}$ terminal. The "1" side of F/F 10 goes from logical zero to logical one, which condition now primes F/F 11's gate 19. FIG. 2 then shows the output labelled F/F 10, which is the waveshape at the "1" terminal of F/F 10, changing state during the first clock pulse. Upon receipt of the second clock pulse through the master set gate 16, F/F 10 cannot change state because it has already been set, but gate 19 being primed by F/F 10 passes the second clock pulse causing it to transfer F/F 11's one side to the set state. This action primes gate 20 of FF 12 via switch $SW_3$. Therefore at the second clock pulse the waveshape labelled F/F 11 shows a transition. The third clock pulse sets F/F 12 whose waveshape at the "1" side is shown in FIG. 2. This action primes gate 21 and F/F 13 is set during the fourth clock pulse. The setting of F/F 13 primes gate 22 via switch $SW_7$ and this flip-flop F/F 14 is set during the fifth clock pulse as shown in FIG. 2. The setting of F/F 14 accomplishes the following. The "1" side of F/F 14 goes to logical one and enables the master reset gate 17, which, in this condition, will now pass clock pulses. Simultaneously, because of the reversion of the "0" side of F/F 14, the master set gate 16 is disabled thereby inhibiting clock pulse. The sixth clock pulse then is coupled through gate 17 and through gate 23 to reset F/F 10. The reset condition of F/F 10 primes gate 24 associated with the $R_{11}$ input to F/F via $SW_2$. The next pulse or seventh then resets F/F 11 which action is shown on the timing diagrams of FIG. 2. Each flip-flop as F/F 12 to F/F 14 are reset in turn, due to the priming action of the preceding stage, until all are reset. In this instance the state of the chain reverts to the initial conditions, where the master set gate 16 is again enabled by F/F 14. If reference is made to the first six waveshapes of FIG. 2, the above described action's timing diagrams are shown. It is noted that the chain of flip-flops F/F 10 to F/F 14 have divided or scaled down the clock pulse frequency or clock repetition rate by a factor of ten. It is also noted that each stage is triggered at a repetition rate equal to the clock frequency divided by ten. Hence the toggle rate problem is completely avoided by this circuit. It is also apparent that each stage is triggered to the set condition in sequence and triggered back to the reset condition in sequence, thus the circuit of FIG. 1 provides a reciprocating or feed forward type action. Therefore the response of each flip-flop as F/F 10 to F/F 14 only has to be fast enough to respond to the rise time or duration of the clock pulse and not to its actual repetition rate. This allows one to use a much slower flip-flop at a substantially higher clock rate to perform scaling or division, as one gains substantial effective trigger time by coupling the flip-flops in the manner shown. The operation of the circuit of FIG. 1 will now be described for the opening of switch $SW_1$ or the placement of $SW_1$ in the dotted or off position. This action allows gate 19 to behave as a single input gate. Now during the receipt of the first clock pulse both F/F 10 and F/F 11 are set; as F/F 11's set state is no longer controlled by F/F 10's "1" output. The timing diagrams of FIG. 2 shows this action as F/F 10 and F/F 11 are set during the first clock pulse. The setting of F/F 11 primes gate 20 associated with F/F 12 and F/F 12 is then set during the second clock pulse. This action proceeds to set F/F 13 during the third clock pulse and F/F 14 during the fourth clock pulse. The setting of F/F 14 during the fourth clock pulse again enables the master reset gate 17 and disables the master set gate 16. Hence F/F 10 to F/F 14 are reset as described above in sequence with the exception that the reset sequence occurs one pulse earlier but again continues for five clock pulses. The second set of five waveshapes shown in FIG. 2, labelled $SW_1$ open, produce a clock division of nine for switch $SW_1$ in the open state. The total speed factor is retained as now each flip-flop in the chain toggles or makes similar transitions at the clock frequency divided by nine. Now assume that $SW_1$ and $SW_2$ are opened, thereby removing control of F/F 10 from affecting gates 19 and 24. The sequence described above for the first four clock pulses is identical as shown by the next respective five waveshapes of FIG. 2 labelled "open $SW_1$ and $SW_2$" when compared with the five waveshapes located directly above and just described. However, when F/F 14 is set thus disabling set gate 16 and enabling master reset gate 17, the fifth clock pulse now resets both F/F's 10 and 11. F/F 11's "0" side then primes gate 25 which causes F/F 12 to be reset during the sixth pulse. The seventh and eighth pulses respectively reset F/F 13 and F/F 14 and the set cycle via the enabling of the master set gate 16 proceeds again. If reference is again made to FIG. 2, it is seen that the opening of switches $SW_1$ and $SW_2$ allows the circuit to perform a scaling or division by a factor of eight.

The bottom five waveshapes also labelled F/F 10 to F/F 14 are shown for the conditions of the opening of $SW_1$, $SW_2$ and $SW_3$ and show the circuit operating as a divide by seven scaler. From the above description it can be seen that as each switch is opened in turn and the open position maintained, the circuit will continuously divide the clock frequency in decreasing single integers. Therefore the circuit of FIG. 1 can divide the clock's frequency by any integer ten or less by the opening of the appropriate switches. These switches can be voltage controlled or manually operated and hence the circuit can perform division or scaling in response to a program or to an operator's selection. The higher the scaling factor is chosen the less sensitive the requirements are for the individual flip-flop used. Greater factors can be obtained by adding more stages wired in the manner shown in FIG. 1. Each flip-flop in the circuit has an output whose repetition rate is the scaled down clock frequency and hence any one can be used to couple out the signal, thus the circuit can supply the scaled frequency to various output circuitry. A most important factor, of course, is the ease to which one can change the scaling factor by the opening of the appropriate switches and hence obtain both odd and even integer division as is evidenced by the following table, showing the scaling capability of the circuit of FIG. 1.

TABLE 1

| Open switches: | Circuit scales by |
|---|---|
| None | 10 |
| $SW_1$ | 9 |
| $SW_1$, $SW_2$ | 8 |
| $SW_1$, $SW_2$, $SW_3$ | 7 |
| $SW_1$, $SW_2$, $SW_3$, $SW_4$ | 6 |
| $SW_1$–$SW_5$ | 5 |
| $SW_1$–$SW_6$ | 4 |
| $SW_1$–$SW_7$ | 3 |
| $SW_1$–$SW_8$ | 2 |

Just as one can obtain increased scaling factors by increasing the number of stages reduced scaling factors are obtainable by decreasing the number of stages.

Figure 3:
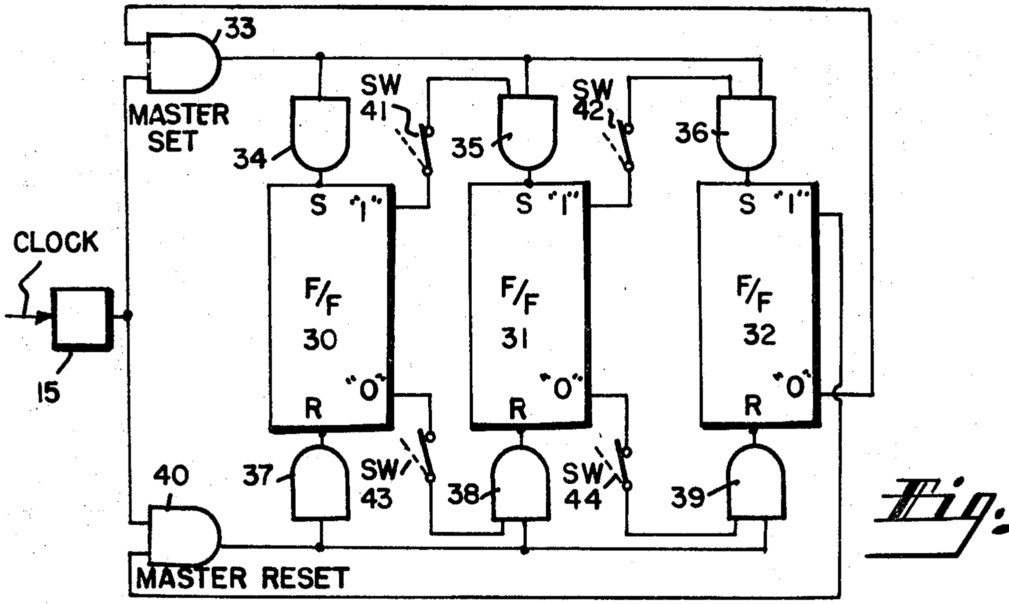
FIG. 3 is a block diagram of another scaler according to this invention.
Figure 4:
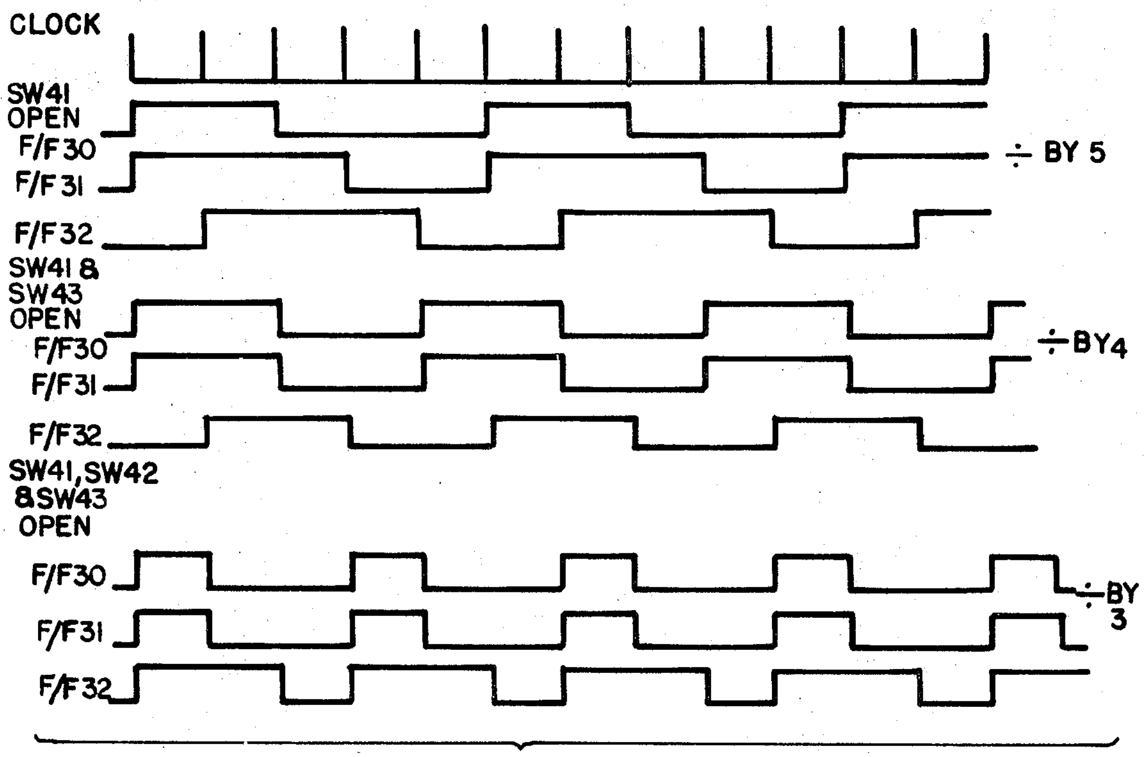
FIG. 4 is a series of timing diagrams used in explaining the operation of FIG. 3.

FIG. 3 shows a scale by six circuit which can scale at a lower integer by the proper switch selection. Three flip-flops F/F 30 to F/F 32 are arranged, as shown, such that the master set gate 33 is controlled by the "0" side of F/F 32 and the master reset gate 40 is controlled by the "1" side of F/F 32. The other input to gate 33 and 40 are supplied by the output of the clock shaping circuit 15; whose function is the same as that described for FIG. 1 and hence the same numerical designation is retained. The master set gate 33 supplies inputs to the gates 34 to 36. In case of gates 35 and 36, their other input is furnished respectively by the "1" sides of F/F's 30 and 31 via switches $SW_{41}$ and $SW_{42}$ respectively. Switches $SW_{41}$ and $SW_{42}$ may be transistor or diode switches as well as mechanical or relay devices as explained previously. In a similar manner the "R" terminals or reset inputs of the flip-flops F/F 30 to F/F 32 are coupled respectively to the output gates 37 to 39. One input of each of these gates 37 to 39 is supplied by the output of the master reset gate 40, while the other inputs to gates 38 and 39 are supplied by the "0" side of F/F's 30 and 31 via $SW_{43}$ and $SW_{44}$ respectively. FIG. 4 shows a series of waveshapes depicting some of the various scaling factors obtainable with the circuit of FIG. 3.

The clock signal is shown in FIG. 4 and labelled clock.

Initially assume all the F/F's 30 to 32 are reset and $SW_{41}$ is open or in the dashed line position. The first clock pulse is coupled through the master set gate 33, which is enabled by the "0" side of F/F 32. This first clock pulse triggers both F/F 30 and F/F 31 causing them to set due to the clock pulse present at the output of gates 34 and 35. This action is shown in FIG. 4 by the diagrams labelled F/F 30 and F/F 31 for $SW_{41}$ open. The second clock pulses sets F/F 32 via gate 36 which was primed by the setting of F/F 31 through $SW_{42}$. The setting of F/F 32 disables the set gate 33 and enables the master reset gate 40. The third clock pulse passes through reset gate 40, through gate 37 and resets F/F 30. The resetting of F/F 30 primes gate 38 which allows F/F 31 to be reset at the fourth clock pulse. This action primes gate 39 which allows F/F 32 to reset at the fifth clock pulse, thus completing the cycle and allowing the above action to be repeated for the next series of clock pulses. The circuit and appropriate waveshapes of FIG. 4, with $SW_{41}$ open, show the scaling of the clock frequency by a factor of five.

Beneath these timing diagrams are those obtainable when opening $SW_{41}$ and $SW_{43}$ to achieve a scaling factor of 4. Finally opening switches $SW_{41}$, $SW_{42}$ and $SW_{43}$ results in the circuit of FIG. 4 operating as a divide by three unit. It is noted that each flip-flop always exhibits a repetition rate equal to the clock frequency divided by the scaling factor and hence the individual circuit need only be responsive to this effective clock rate. The circuit is particularly useful as it can divide or scale by odd as well as even integers.

Figure 5:
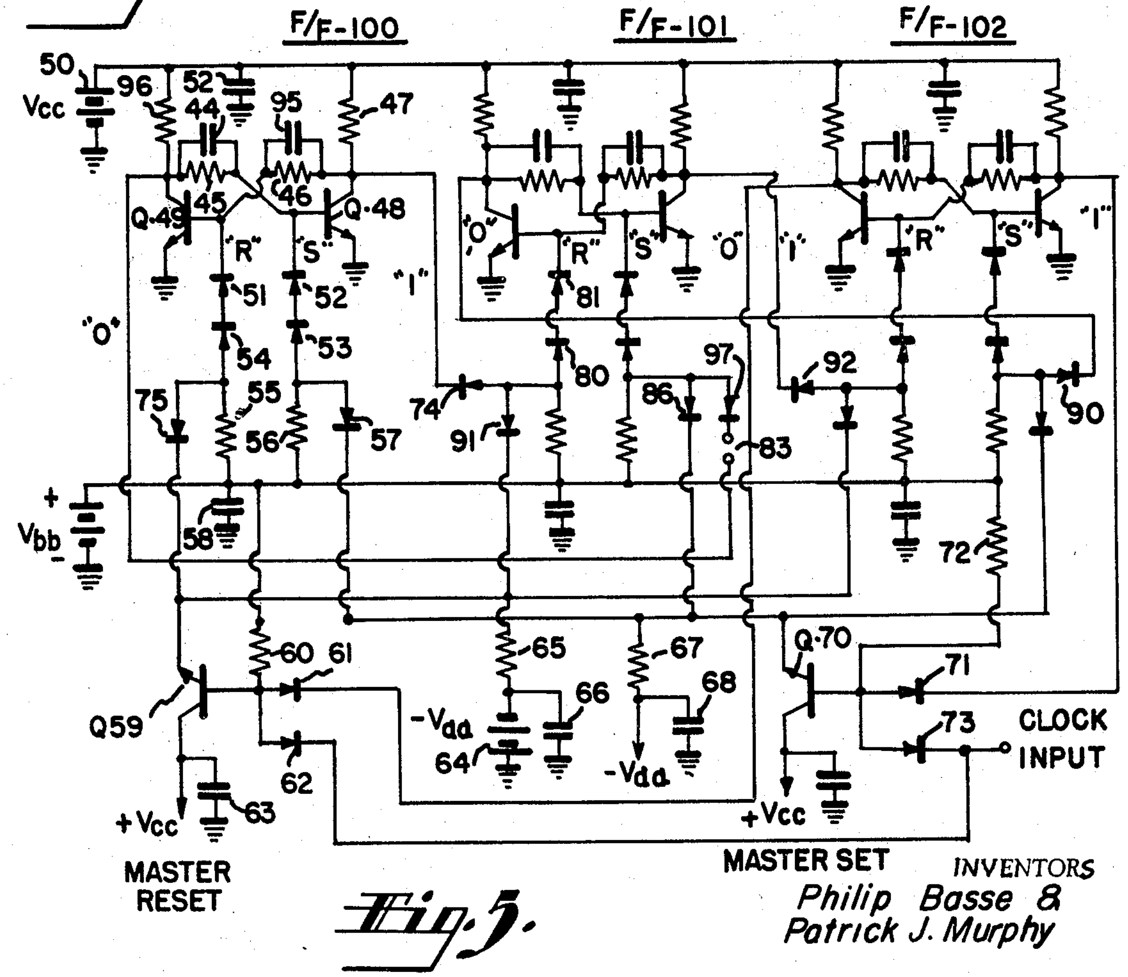
FIG. 5 is a circuit diagram of a scale of five counter according to this invention.

If reference is made to FIG. 5 there is shown a circuit schematic of a scale by five unit according to this invention. There is shown three flip-flops generally designated as F/F 100 to F/F 102 respectively. The circuit components and configurations for each are identical and hence the specific construction and structure of F/F 100 will be described in detail as applying to F/F 101 and F/F 102 as well. There is shown a source of biasing potential 50 designated as $V_{cc}$ and having its negative terminal returned to a point of reference potential such as ground. The positive terminal of the $V_{cc}$ source 50 is coupled to one terminal of the collector load resistors 47 and 96 and to a terminal of a decoupling capacitor 52. The other terminal of capacitor 52 is returned to ground. The active elements associated with F/F 100 are the NPN transistor's Q49 and Q48 each having a base, collector and emitter electrode. The collector electrode of Q49 is coupled to the other terminal of collector resistor 96 while the collector of Q48 is coupled to the other terminal of collector resistor 47. Both emitter electrodes of Q49 and Q48 are returned to a point of reference potential such as ground. To enable bistable operation and afford regeneration there is shown shunt networks consisting of capacitors 44 and 95 in parallel with resistors 45 and 46 respectively. The network comprising capacitor 95 and resistor 46 is coupled to the collector electrode of Q48 at one end and to the base electrode of Q49 at its other end. The network formed by resistor 45 and capacitor 44 is coupled between the collector of Q49 and the base of Q48. Capacitors 44 and 95 are known as commutating or speed up capacitors and serve to neutralize the stored base charge in the transistors Q48 and Q49 and hence help avoid storage time delay problems. The resistors 45 and 46 serve to maintain the bases of Q48 and Q49 at a level determined by the state of the flip-flop F/F 100 as will be described. Also shown coupled to the base of Q49 are two series diodes 51 and 54 which serve to couple trigger pulses to the base of Q49 to effect a change in state. Connected to the base of Q48 are also two diode 52 and 53 which serve to copule trigger pulses to the base of Q48. The diodes 51 and 54 are in series with the cathodes of 54 coupled to the annode of 51, the cathodes of 51 is coupled to the base of Q49. The anode of 54 is returned to a biasing source $+V_{bb}$ through a resistor 55, as is the anode of diode 53 through resistor 56. A capacitor 58 is shown connected between the positive terminal of $V_{bb}$ and ground and serves as a decoupling capacitor for $V_{bb}$. The collector of Q48 is coupled to the cathode of a diode 74 whose anode is coupled to two series diodes 80 and 81 coupling this point to the base of one transistor of F/F 101. The collector of Q49 has a lead which terminates at terminal 83. There is also shown an NPN transistor Q59 which has its collector returned to the bias supply 50, or $V_{cc}$, and to one terminal of a decoupling capacitor 63, whose other terminal is returned to ground. Transistor Q59 and its associated circuitry is referred to as the master reset gate and performs the function of gate 17 or 40 of FIGS. 1 and 3 respectively. The base circuit of Q59 comprises a resistor 60 having one terminal coupled to Q59's base and its other terminal returned to $+V_{bb}$. The base of Q59 is also coupled to the anodes of diodes 61 and 62 respectively. The cathode of diode 62 is coupled to a lead designated as clock input, while the cathodes of 61 is coupled to the collector of the left-handed transistor of F/F 102. The emitter terminal or electrode of Q59 is coupled to the cathode of diode 75 whose anode is coupled to the junction of resistor 55 and the anode of diode 54. Transistor Q59's emitter is also coupled to the anode of a diode similarly situated for each flip-flop stage as F/F 101 and F/F 102. Finally the emitter of Q59 is coupled to a point of reference potential 65 designated as $-V_{aa}$ through a biasing resistor 65. The bias source $-V_{aa}$ is decoupled by capacitor 66.

Also shown is a transistor Q70 having its collector electrode returned to $+V_{cc}$ and appropriately decoupled. The transistor Q70 and the associated circuitry performs the function of the master set gate, which was designated as gates 16 and 33 respectively in FIG. 1 and FIG. 3. The base of Q70 is coupled to the bias supply $+V_{bb}$ through resistor 72 and is also coupled to the anodes of diodes 71 and 73. The cathode of diode 73 is returned to the clock input lead while the cathode of diode 71 is returned to the collector side of the other transistor of F/F 102. The emitter electrode of Q70 is coupled through biasing resistor 67 to bias suply 64 or $-V_{aa}$ and is also coupled to the cathode of diode 57 whose anode is coupled to the junction of resistor 56 and the anode of diode 53. Transistor Q70's emitter is likewise coupled to a similar diode, as diode 57, for the other flip-flop circuits F/F 101 and F/F 102. The flip-flop circuit F/F 100, as well F/F 101 and 102, can only be in one of two stable states. Assume then that Q48 is conducting, hence the potential at its collector is low compared to $+V_{cc}$. This low potential is coupled to the base of Q49 through resistor 46 and is insufficient to cause conduction of Q49, hence its collector is aproximately at $+V_{cc}$. This further assures that Q48 is conducting as $+V_{cc}$ is coupled through resistor 45 to the base of Q48. If one now assumes that Q49 is conducting it will be seen that Q48 is non-conducting, hence the circuit F/F 100 can exist in either state. In this manner the collector of Q48 is designated as the "1" side of F/F 100 while that of Q49 is the "0" side. The "1" side of F/F 101 and 102 are then taken from the collectors of the right-handed positioned transistors and the "0" side from the left. The base of Q48 is designated as the "S" or set side and the base of Q49 as the "R" or reset side.

The appropriate corresponding electrodes for F/F's 101 and 102 are designated accordingly. Assume that the "1" sides of F/F 100 to 101 are all at $+V_{cc}$, and hence Q48 and the right-handed position transistors of F/F's 101 and 102 are non-conducting. The "1" side of F/F 102 causes diode 71 to be reversed biased as $+V_{cc}$ is selected more positive than $+V_{bb}$. However the clock input lead coupled to diode 73's cathode is at low potential or ground and diode 73 conducts causing the voltage at the base of Q70 to be at ground potential. If a suitable positive transition appears on the clock input line, diode 73 becomes reversed biased and the base of Q70 goes positive in response to this clock input. The emitter of Q70 then goes from ground towards $+V_{cc}$ and this positive transition reverse bias diodes 57 and 86 associated with the "S" inputs of F/F 100 and 101 respectively. The voltage at the junction of the anode of diode 57 with resistor 56 goes positive towards $+V_{bb}$ and this transition is coupled into the base of Q48 by diodes 53 and 52. This positive pulse causes Q48 to conduct, thus causing its collector potential to go from $+V_{cc}$ towards ground and regeneration causes Q49 to turn off. Therefore the first clock pulse sets F/F 100, and by the same action sets F/F 101 via diode 86. It is noted that if terminal point 83, which is coupled to the "0" side of F/F 100, or Q49's collector, were connected to the cathode of diode 97, F/F 101 would not set as diode 97 would be forward biased and hence the anode side would be clamped close to ground irrespective of a transition at the anode of diode 86. The setting of F/F 101 now causes its "0" side to be at $+V_{cc}$ thus reverse biasing diode 90. The next clock pulse couples to the set or "S" side of F/F 102 causing its "1" side to go from $+V_{cc}$ to ground. This in turn forward biases diode 71 clamping the master set gate's transistor Q70's base to ground and enables the master reset gate's transistor Q59 by reverse biasing diode 61. The third or next clock pulse reverse biases diode 62. This causes the emitter of Q59 to go positive, reverse biasing diode 75 and thereby producing a positive transition which is coupled through diodes 54 and 51 to the base of Q49. This triggers Q49 from the off to on state returning the collector of Q48 to $+V_{cc}$ due to regeneration in F/F 100. The next or fourth clock pulse resets F/F 101 through diodes 80, 81 and 91, as diode 74 was reversed biased by Q48's collector potential. This in turn primes F/F 102 via diode 92 so that F/F 102 is reset by the fifth clock pulse. The cycle described above is then repeated and hence the circuit shown performs a scale by five and operates to produce the waveshapes shown in FIG. 4, as the top four, with the exception that the outputs designated therein as F/F 30 to F/F 32 are those obtained from F/F 100 to F/F 102 and the status of $SW_{41}$ being opened corresponds to not connecting terminal 83 to the cathode of diode 97.

It is also noted that contrary to state of the art belief, the transistor circuits of FIG. 5 are triggered by turning a respective transistor on rather than off. The prior art teaches that it is preferable to have the trigger turn a transistor off rather than on, because the off transistor usually has a reverse biased emitter junction. This bias potential must be overcome by the trigger before switching can start. Triggering the off transistor on allows the circuit to respond to narrow clock pulses as there is no stored charge to overcome.

The circuit shown in FIG. 5 used the following components for a scale of five reduction using clocks in excess of 150 mHz.

All transistors as Q48, Q49, 59 and 70—2N709
All diodes as 51, 52, 53, 54, 75, 76 and so on—1N914
C44 and C95—20 micromicrofarads
R96 and R47—220 ohms
R45 and R46—470 ohms
R55 and R57—330 ohms
C52, C63, C66, C68—.047 microfarad
C58—.001 microfarad
R60, R65, R67, R72—220 ohms
$+V_{cc}$—6 volts
$+V_{bb}$—6 volts
$-V_{aa}$—12 volts It is understood that one skilled in the art may substitute different conductivity transistors or reverse polarity of diodes to obtain the operation as described, without departing from the scope of this invention.

What is claimed is:

1. A programmable scaler for high frequency signals, comprising, (a) a plurality of bistable devices, each having two input terminals and two output terminals, said bistable devices being arranged in a predetermined order from a given first one of said bistable devices, to a given last one, (b) first and second coincidence gates each having two input terminals and one output terminal, (c) means for coupling one input terminal of said first coincidence gate to one output terminal of said last bistable device, (d) means for coupling one input terminal of said second coincidence gate to said other input terminal of said last bistable device, (e) logic means coupling said respective output terminals of said first and second coincidence gates to respective different ones of said input terminals of said bistable devices, said logic means including means for strapping certain ones of said output terminals of certain of said bistable devices other than said last bistable device to certain ones of said input of the next successive bistable device, (f) means coupling said other input terminal of said first and second coincidence gates responsive to said high frequency signals to cause said plurality of bistable devices to change state in accordance with said strapping means.

2. A programmable circuit for scaling high frequency signals by a given integer which may be selected, comprising, (a) a plurality of bistable devices, each having two inputs and two outputs, said bistable devices being arranged in a predetermined order from a given first one of said bistable devices to a given last one, (b) first and second coincidence gates each having two input terminals and one output terminal, (c) means for coupling one input terminal of said first coincidence gate to one output of said last bistable device, (d) means for coupling one input terminal of said second coincidence gate to said other output of said last bistable device, (e) logic means coupling said respective output terminals of said first and second coincidence gates to respective different ones of said input terminals of said bistable devices, (f) switching means coupled between said logic means and said bistable devices' outputs for selecting certain of said bistable devices to control said logic means in a sequence determined by said given integer, and (g) means coupling said other input terminal of said first and second coincidence gates to a source of high frequency signals.

3. A circuit for scaling down a high frequency input signal by a given odd or even integer which may be preselected comprising (a) a plurality of transistor flip-flop each having a direct current set and reset input terminal and each further having a ONE side and a ZERO side output terminal, being arranged in a predetermined order from a given first one to a given last one, (b) first and second coincidence means each having an output terminal and one input terminal adapted to receive said high frequency input signal, said first and second coincidence means further having another input terminal to which terminal of said first coincidence means is coupled the ONE side of said given last transistor flip-flop and said ZERO side output terminal of said given last transistor flop-flop being coupled to said other input terminal of said second coincidence means, (c) a plurality of first gating means each having an output terminal and at least one input terminal coupled to said output terminal of said first coincidence means, each separate one of said gating means having its output terminal coupled to a different one of said flip-flops set side input terminals, (d) a second plurality of gating means, each having an output terminal and at least one input terminal coupled to said output terminal of said second coincidence means, each separate one of said gating means having its output terminal coupled to a different one of said flip-flop's reset input terminals, (e) switching means for coupling said ONE and ZERO sides of said other transistor flip-flops except said given one individually to another separate input terminal of said first and second plurality of gating means for selecting said given integer, (f) means coupled to said first and second coincidence means input adapted to receive said high frequency signal, for operating said coincidence means in acordance with the status of said given flip-flop to cause said other transistor flip-flops to sequentially scale said high frequency signal by said given integer determined by said selection of said switching means.

4. A circuit for scaling a high frequency clock signal by a factor of five comprising, (a) first, second and third bistable devices each having a set and reset input terminal and a ONE and ZERO output terminal, (b) a first coincidence gate having two input and one output terminals, one of said input terminals adapted to receive said high frequency clock, said other input terminal connected to the ONE output terminal of said third bistable device, (c) a second coincidence gate having two input terminals and an output terminal, one of said input terminals adapted to receive said high frequency clock, said other input terminal connected to the ZERO output terminal of said third bistable device, (d) first, second and third gating means each having an output terminal, and at least one input terminal coupled to the output terminal of said first coincidence gate, said first gating means having its output terminal coupled to the set input terminal of said first bistable device, said second gating means having its output terminal coupled to the set terminal of said second bistable device, said third gating means having its output terminal coupled to said set input terminal of said third bistable device, said third gating means further having another input terminal coupled to said second bistable's ONE output terminal, (e) fourth, fifth and sixth gating means each having an output terminal and each having at least one input terminal coupled to the output terminal of said second coincidence means, said fourth gating means having its output terminal coupled to the reset input terminal of said first bistable device, said fifth gating means having its output terminal coupled to the reset input terminal of said second bistable device, said sixth gating means having its output terminal coupled to said reset input terminal of said third bistable device, said fifth gating means further having another input terminal coupled to said first bistable's ZERO output terminal, said sixth gating means further having another input terminal coupled to said second bistables' ZERO output terminal, (f) means for applying a high frequency clock signal to said adapted inputs of said first and second coincidence means to cause said bistable devices to scale said clock signal's frequency by a factor of five by operating said first, second, third, fourth, fifth and sixth gating means in accordance with the status of said bistable devices and said clock signal in a reciprocating manner.

5. The circuit according to claim 4 wherein said first, second and third bistable devices are NPN transistor saturating flip-flop circuits.

6. The circuit according to claim 5 wherein said first and second coincidence gates are two input diode AND gates.

7. The circuit according to claim 6 wherein said first, second, third, fourth, fifth and sixth gating means are diode gates arranged to provide a coincidence operation.

8. A circuit for dividing a high frequency signal by any given integer, comprising:

(a) a plurality of bistable circuits arranged from a given first to a given last, each having first and second output terminals and first and second input terminals, said bistable circuits operative to provide a first level at one of said output terminals for application of a signal to a corresponding one of said input terminals, said other output terminal being at a second level, (b) a first plurality of coincidence gates each having a separate output terminal coupled to a first input terminal of a different one of said bistable devices, each of said gates having two input terminals, (c) a second plurality of coincidence gates each having a separate output terminal coupled to a second input terminal of a different one of said bistable devices, each of said second gates having two input terminals, (d) a first AND gate having two input terminals and having one of said input terminals coupled to one output terminal of said last bistable device, said first AND gate having an output terminal coupled to one input terminal of all of said first plurality of coincidence gates, (e) a second AND gate having two input terminals and having one of said input terminals coupled to said other output of said last bistable circuit, said second AND gate having an output terminal coupled to one input terminal of all of said second plurality of coincidence gates, (f) a plurality of first switching means, each separate one coupled between a first output terminal of a different bistable circuit except said last and said other input terminal of a different one of said first plurality of coincidence gates, said switching means operative in a first position to connect said bistable output terminal to said coincidence gate input terminal and in a second position to disable said connection, (g) a plurality of second switching means, each separate one coupled between a second output terminal of a different bistable circuit except said last and said other input terminal of one of said second plurality of coincidence gates, said second switching means operative in a first position to connect said bistable output terminal to said coincidence gate input terminal and in a second position to disable said connection, (h) means coupled to said other input terminal of said first and second AND gate responsive to said high frequency signal to cause said plurality of bistable circuits to provide a divided output signal frequency according to the positions of said plurality of first and second switching means, and whereby said first AND gate provides said high frequency signals at said output only for said first level at said output of said last bistable circuit and said second AND gate provides said high frequency signals at said output only for said first level at said second output of said last bistable circuit.

References Cited

UNITED STATES PATENTS

| | | | |
|---|---|---|---|
| 3,030,581 | 4/1962 | Johnson | 328—43 |
| 3,105,195 | 9/1963 | Tarczy-Hornoch | 328—43 |
| 3,287,648 | 11/1966 | Poole | 328—48 |
| 3,345,574 | 10/1967 | Hilberg | 328—43 |
| 3,371,282 | 2/1968 | Vande Wege | 328—43 |

JOHN S. HEYMAN, Primary Examiner

S. D. MILLER, Assistant Examiner

U.S. Cl. X.R.

307—223, 224; 328—42, 43, 48, 49